(12) United States Patent
Fischer et al.

(10) Patent No.: US 9,111,194 B2
(45) Date of Patent: Aug. 18, 2015

(54) CONTACTLESS DATA TRANSMISSION DEVICE, SECURITY AND/OR VALUABLE DOCUMENT INCLUDING THE SAME AND METHOD FOR MANUFACTURING THE CONTACTLESS DATA TRANSMISSION DEVICE

(71) Applicant: Bundesdruckerei GmbH, Berlin (DE)

(72) Inventors: Jörg Fischer, Berlin (DE); Oliver Muth, Berlin (DE); Manfred Paeschke, Wandlitz (DE); Markus Tietke, Berlin (DE); Joachim Kloeser, Berlin (DE); Denis Holinski, Berlin (DE); Alexander Ferber, Berlin (DE); Stefan Trölenberg, Mittenwalde OT Ragow (DE)

(73) Assignee: BUNDESDRUCKEREI GMBH, Berlin (DE)

( * ) Notice: Subject to any disclaimer, the term of this patent is extended or adjusted under 35 U.S.C. 154(b) by 0 days.

(21) Appl. No.: 14/382,138

(22) PCT Filed: Feb. 25, 2013

(86) PCT No.: PCT/EP2013/053731
§ 371 (c)(1),
(2) Date: Aug. 29, 2014

(87) PCT Pub. No.: WO2013/127745
PCT Pub. Date: Sep. 6, 2013

(65) Prior Publication Data
US 2015/0028107 A1    Jan. 29, 2015

(30) Foreign Application Priority Data
Mar. 1, 2012 (DE) .......................... 10 2012 203 251

(51) Int. Cl.
*G06K 19/077* (2006.01)
*H04B 5/00* (2006.01)
(Continued)

(52) U.S. Cl.
CPC .......... *G06K 19/07783* (2013.01); *B42D 25/00* (2014.10); *G06K 19/07745* (2013.01);
(Continued)

(58) Field of Classification Search
USPC ........................... 235/488, 492; 343/700 MS
See application file for complete search history.

(56) References Cited

U.S. PATENT DOCUMENTS 6,522,308 B1   2/2003  Mathieu
6,651,891 B1   11/2003 Zakel et al.
(Continued)

FOREIGN PATENT DOCUMENTS

DE   19732353 A1   2/1999
DE   10258670 A1   6/2004
(Continued)

*Primary Examiner* — Allyson Trail
(74) *Attorney, Agent, or Firm* — Frank J. Bonini, Jr.; John F. A. Earley III; Harding, Earley, Follmer & Frailey, P.C.

(57) ABSTRACT

This present invention serves to simplify manufacture of a contactless data transmission device (50). This device (50) has an electrically insulating carrier (1), a circuit element arranged on the carrier (1) made from a continuous antenna conductor track (2) in the form of at least one spiral winding (4, 5, 6) and respectively one terminal contact (15, 16) at the ends thereof as well as an electronic component (3) with at least two contact points (11, 12) electrically connected with the circuit element. The electronic component (3) is placed in a mounting region (10) above the at least one spiral winding (4, 5, 6). The at least two contact points (11, 12) of the component (3) are electrically connected with a respective terminal contact (15, 16) of the antenna conductor track (2). At least one spiral winding (4, 5, 6) is branched outside the mounting region (10) between two respective branching points (7', 7"; 8', 8"; 9', 9") into at least two spiral winding branches (4', 4"; 5', 5"; 6', 6"). The data transmission device (50) is a component part of a valuable and/or security document (100).

20 Claims, 8 Drawing Sheets (51) Int. Cl.
  *B42D 25/00* (2014.01)
  *H01Q 1/22* (2006.01)
(52) U.S. Cl.
  CPC ........ *G06K19/07754* (2013.01); *H01Q 1/2225*
    (2013.01); *H04B 5/0056* (2013.01); *H04B*
    *5/0081* (2013.01); *H01L 2224/16225* (2013.01);
    *H01L 2224/16227* (2013.01); *H01L 2224/81191*
    (2013.01); *H01L 2924/07811* (2013.01)

(56) References Cited

U.S. PATENT DOCUMENTS

| | | |
|---|---|---|
| 2006/0250534 A1 | 11/2006 | Kutscher et al. |
| 2008/0198078 A1 | 8/2008 | Caruana et al. |
| 2009/0315799 A1 | 12/2009 | Eray et al. |
| 2010/0156723 A1* | 6/2010 | Luch ..................... 343/700 MS |
| 2010/0182211 A1 | 7/2010 | Peters |
| 2012/0000985 A1* | 1/2012 | Bove ............................. 235/492 |
| 2012/0175422 A1* | 7/2012 | Zambon ....................... 235/488 |
| 2014/0203991 A1* | 7/2014 | Yosui ............................ 343/866 |

FOREIGN PATENT DOCUMENTS

| | | |
|---|---|---|
| DE | 102010028444 A1 | 11/2011 |
| EP | 1715374 A1 | 10/2006 |
| WO | WO 99/53371 A | 10/1999 |
| WO | WO9953371 A | 10/1999 |
| WO | WO2004055721 | 7/2004 |
| WO | WO2011134712 | 11/2011 |

\* cited by examiner

CONTACTLESS DATA TRANSMISSION DEVICE, SECURITY AND/OR VALUABLE DOCUMENT INCLUDING THE SAME AND METHOD FOR MANUFACTURING THE CONTACTLESS DATA TRANSMISSION DEVICE

BACKGROUND OF THE INVENTION

1. Field of the Invention

The present invention concerns a contactless data transmission device, a valuable and/or security document which contains a data transmission device of this type, as well as a method for manufacturing the contactless data transmission device.

2. Brief Description of the Related Art

Contactless data transmission devices of this type are known. In order to achieve data storage and/or data processing in a valuable and/or security document, for example, electronic components have been integrated into the document for some time now with which the data can be stored and/or processed. According to the invention, one particularly means semiconductor chips when one refers to electronic components, in particular such chips which are suitable for storage and processing of data. The electronic components can, in particular, be electronic semiconductor circuit elements. The electronic components can particularly include so-called RFID chips which are suitable for contactless communication. RFID chips can be comparatively simple, for example only contain a serial number, and can contactlessly transmit this serial number upon activation or they can be memory chips with encryption as used, for example, in electronic travel documents. A contact field matrix consisting of a number of contact fields according to ISO 7816 can, for example, serve for data communication with external devices which are connected with the chip and, upon use of the document, for example a card, create an electrical contact to external data sources and data storage devices via input and output devices.

According to a further development of such valuable and/or security documents there are also contactless documents available which also contain electronic components for saving and processing data and which are also fitted with an antenna for exchange of data via input and output devices with external data sources. In this case, data are exchanged in this way with the components in the document by means of a read-write apparatus in such a way that the read-write apparatus generates an electromagnetic alternating field having a carrier frequency which is typically in the radio waves range, which is detected by the antenna in the document and converted into electrical signals which are passed on to the component. To output the data arising from the document the antenna generates a corresponding electromagnetic alternating field which is detected by the read-write apparatus. Such transponders or RFID (radio frequency identification device) systems have also been known for some time. Contactless communication can, for example, take place according to ISO 14443.

DE 10 2010 028 444 A1 shows a document with a chip and an antenna for inductive coupling of energy. The antenna of this document has an outer winding, at least one middle winding, and an inner winding, wherein the middle winding is arranged between the outer and the inner winding and the chip is electrically contacted with the outer and inner winding. The middle winding bridges the chip in a bridging area of the antenna. The antenna is formed as a spiral. The chip is mounted above the antenna windings using the flip-chip technique. The antenna windings can have a smaller width in the chip area than that in the remainder area of the windings.

DE 197 32 353 A1 A describes a contactless chip card, which has an insulating, one-piece, card body with a recess on one side of the card body, an electrically conductive coil which is directly arranged on surface areas of the side of the card body with at least one recess, as well as an unhoused chip, which is arranged in the recess. The chip connecting surfaces of the chip are electrically contacted with the connections for the coil by means of the flip-chip technique.

U.S. Pat. No. 6,522,308 B1 provides a coupling antenna which has one or more capacitors and is designed in the form of windings on a carrier. The capacitor is formed by a first and a second conductive surface and an insulating surface lying in-between. A resonant circuit is formed by interconnection of the antenna with the capacitor.

To provide for simplified and cost-effective manufacture of a transponder DE 102 58 670 A1 describes a structure with an electronic circuit and an antenna device which is formed by at least two commonly drivable oscillating circuits each with a coil, which are galvanically separated from one another. One of the oscillating circuits is galvanically connected with the electronic circuit. The other oscillating circuit has a capacitor. Both oscillating circuits can, for example, be arranged in various levels congruently one above the other or also interleaved. Preferably, each of the coils has only one single winding. The resonance frequency of the transponder depends on the number of oscillating circuits and on the resonance frequencies which the oscillating circuits would respectively individually have for operation which is decoupled from one another. It is smaller than the lowest resonance frequency of the individual oscillating circuits. It is stated that this allows the resonance frequency to be set optimally by the number and design of the individual oscillating circuits.

A resonant circuit is described in US 2008/0198078 A1 with an antenna for a resonant circuit which has spiral windings and with a module with an electronic chip. To adapt the resonance frequency of the antenna, it has, in a partial zone some distance apart from one another, spiral windings which differ from those in other partial zones. These distances can, in particular, be greater than those in the other partial zones.

US 2009/0315799 A1 furthermore describes an electronic unit, which has both an electronic circuit and an associated antenna. The antenna in turn has a loop which is connected with the electronic circuit, as well as a resonator which is coupled to the loop. The resonator is formed of conductive windings with free ends. It is stated that use of the resonator, on the one hand, amplifies the electrical signals and, on the other hand, creates greater flexibility as concerns the design of the antenna.

The transponders mentioned above do, however, prove to be disadvantageous since the investment required for their manufacture is relatively high. For example, manufacture of the transponder according to DE 102 58 670 A1 requires capacitors to be manufactured. This requires additional operational steps which increase the costs involved. The same applies for the antenna specified in U.S. Pat. No. 6,522,308 B1. The circuit shown in US 2009/0315799 A1 has the disadvantage that the resonance frequency achieved with the antenna arrangement is very high so that tuning of the circuit in a range which is required for commercial use (in the range of 30 kHz to 30 GHz, preferably 3 to 30 MHz, for example 13.56 MHz), is not possible or extremely difficult to achieve.

This being the case, there is the problem that manufacture of the known transponders is expensive and that the transponders may well not readily be usable in a prescribed frequency range. The technical problem on which the present invention is based lies in creating a contactless data transmission device according to ISO 14443 which is simple and economic to make and which can be used in a prescribed frequency range. It should also, in particular, be ensured that the data transmission device can exactly be adjusted/trimmed by simple means to the prescribed resonance frequency. Since one significant field of application of the present invention, is to also use the data transmission device in valuable and/or security documents, one must also ensure that the document cannot be manipulated. It is above all necessary to ensure that an electronic semiconductor chip contained in the document cannot be removed and manipulated or replaced by another chip without this manipulation being recognizable afterwards.

SUMMARY OF THE INVENTION

The above-mentioned problems are solved by the data transmission device according to the invention.

In as far as the term "valuable and/or security document" or "security and/or valuable document" is used in the description and in the claims of the present application, reference is being made, for example, to a passport, personal identification card, driving license or another type of ID card or an access control pass, a vehicle identification card, vehicle registration document, visa, check, means of making a payment, in particular a bank note, a check card, bank card, credit card or cash card, customer card, healthcare card, chip card, a company pass, credential, membership card, gift or shopping voucher, bill of lading or another type of credential, revenue stamp, postage stamp, ticket, jetton, adhesive label (for example for product security) or another ID document. The valuable and/or security document is in particular a smart card and is, for example, in the format ID 1, ID 2, ID 3 or any other format, for example in a booklet form such as is the case for an object similar to a passport. A valuable and/or security document is generally a laminate made up of a plurality of document layers to yield a flat object, wherein the document layers exactly match to each other and are connected through the action of heat and under high pressure. The documents shall meet the standardized requirements, of ISO 10373, ISO/IEC 7810, ISO 14443 for example. The document layers consist, for example, of a carrier material which is suitable for lamination.

In as far as terms are used below in the description and in the claims in the singular form, for example the terms (electrically insulating) carrier, support layer, circuit element, spiral winding, spiral winding branch, terminal contact, (electronic) component, contact point, antenna conductor track, connecting element and others, the intention is also to refer to the plural form, independent of the context in which the terms are used, in as far no other regulation is expressly specified. Conversely, the respective singular form can also occur in their place, in as far as such terms are used in the plural form, independent of the context in which these terms are used, in as far no other regulation is expressly specified.

According to a first aspect of the present invention, a contactless data transmission device is provided.

According to a second aspect of the present invention, a valuable and/or security document is provided which has this contactless data transmission device.

According to a third aspect of the present invention, a method for manufacturing the contactless data transmission device is provided.

The contactless data transmission device according to the invention can, in particular, be an integral component of the valuable and/or security document according to the invention, for example of a smart card or an identification document. For example, the document can be a personal identification card, passport, access pass, driving license, vehicle registration document, vehicle identification card, company pass, skiing pass or another type of authorization pass, a ticket for use on local public transport, a bank note, credit card, check card, cash payment card, admission ticket, identification card, a visa or the like. The document can be in the form of a card having a front side and a rear side or be designed as a book-like document. It can essentially be made from paper or also plastic. In the case of a personal identification card its front side can, for example, show a picture as well as the name of the owner. The rear side can contain further details such as the address of the owner. The document can be designed as a transponder, in particular as a passive transponder, for example as an RFID security document.

The document contains at least one electronic component, in particular a semiconductor circuit element, also known as a chip. This element is used as a data processing system in the document which, for example, has a cryptographic function for signing and/or authentication, a payment function or another function for performing a financial transaction or an identification function, in particular with reproduction of a picture on a display device.

The valuable and/or security document according to the invention has at least two plastic layers bound together through lamination, wherein one of the layers is formed by the contactless data transmission device according to the invention and the electrically insulating carrier of the data transmission device is manufactured from plastic. Alternatively, the document can also be manufactured by casting of the electronic components (contactless data transmission device with chip, antenna) in plastic material.

The contactless data transmission device according to the invention has the following components but is not limited to them:
  an electrically insulating carrier,
  a circuit element arranged on the carrier which has a continuous antenna conductor track in the form of at least one spiral winding, for example of one, two, three, four, five, six, seven, eight or still more spiral windings and respectively one terminal contact at the ends of the antenna conductor track, and
  an electronic component connected electrically with the circuit element with at least two contact points; the electronic component is placed in its respective mounting region above the at least one spiral winding; the at least two contact points of the component are electrically connected with respectively one contact point of the antenna conductor track.

The circuit element serves to achieve inductive coupling of energy which is produced by a read-write apparatus.

The electronic component and the antenna conductor track are preferably arranged parallel to the front and rear side of the valuable and/or security document in which the contactless data transmission device is integrated. The carrier is capable of being integrated as document layer into the document. Besides the carrier, a compensation layer, which is arranged on the side of the carrier, on which there is also the electronic component and which has a recess for receiving the component, can also be provided. The thickness of the compensation layer preferably approximately corresponds to the mounting height of the component.

In a novel manner according to the invention at least one spiral winding of the antenna conductor track branches off outside the mounting region into at least two, for example two, three or four, spiral winding branches and does this respectively between two branching points of a spiral winding.

The spiral winding branches off over its course at one first branching point, for example into two spiral winding branches, and these branches are brought back together again at a second branching point forming a single-track spiral winding. In this way adjacent spiral winding branches are respectively created which together form a multi-track spiral winding. The branching points at which the spiral winding branches of a spiral winding meet one another preferably lie as far apart as possible from one another, which means as close as possible at the mounting region or within the mounting region. The branching points can, for example, be arranged immediately adjacent to the mounting region of the electronic component so that the spiral windings essentially run in a multi-track manner along their whole course outside the mounting region. If the spiral windings cross/traverse the mounting region of the component, i.e., cross over or under the component, splitting of the spiral windings at the branching points which are directly adjacent to the mounting region of the component, maximizes the length of the splitting of the spiral windings in respective spiral winding branches outside the mounting region, in that the spiral winding branches practically extend over the whole length of the spiral winding areas which run outside the mounting region of the component. The spiral windings can also naturally be split in spiral winding areas that are shorter than the spiral winding areas that are respectively running outside the mounting region. In this case, the branching points are not arranged respectively directly adjacent to the mounting region but rather more some distance from these. Furthermore, the spiral windings can also respectively be split a number of times in a spiral winding area between two consecutive crossing points with the mounting region in spiral winding branches and in a run single-track manner between them. In the last case there are respectively at least four branching points in the spiral windings between two consecutive crossing points with the mounting region. In this way the branching points in the spiral windings may be arranged at a number of locations between two consecutive crossing points with the mounting region. Preferably, the spiral windings are not guided in a plurality of spiral winding branches in the mounting region but are guided in the form respectively of single-track spiral windings, i.e., not split up in spiral winding branches.

The spiral winding branches can, for example, run parallel to one another. In this way a circumferential strand of spiral windings, as is for a coil, is formed. As a very particularly preferred feature, adjacent spiral windings/spiral winding branches huddle as close as possible together. For example, the distance between two adjacent spiral windings/spiral winding branches is less than 1 mm, preferably less than 500 µm, particularly preferred less than 350 µm. The distance can furthermore be at least 10 µm, preferably at least 50 µm, particularly preferred being at least 100 µm. The distance is preferably about 250 µm. The smaller the distance between the spiral winding branches of the adjacent spiral windings, the greater the electrical capacity that is generated by the antenna conductor track. In this way, lowering of the electrical inductance through splitting of the spiral windings in spiral winding branches can be countered.

The splitting of the spiral windings in spiral winding branches changes the electrical properties of the circuit element and therefore also the resonance frequency of the data transmission device. Through splitting of the spiral windings of the antenna conductor track, the total inductance of the circuit element reduces through parallel connecting of partial inductances, which are generated by the individual spiral winding branches so that the resonance frequency of the device is increased. The extent of this increase depends on the scope of the splitting (splitting of one/a plurality of full spiral windings outside the mounting region or just partial splitting of one or a plurality of spiral windings, splitting into two, three or more spiral winding branches), the position and length of the splitting, the width and distance between the spiral winding branches and naturally also of the other parameters of the spiral-shaped antenna conductor track, such as the number of spiral windings, the shape of the spiral windings etc. Therefore, in order to adapt the resonance frequency of the data transmission device to a prescribed value, an additional dimensioning parameter is created, which can be used in order to adapt the circuit element to the requirements of the read-write apparatus or the reading device, which addresses the transponder. The splitting of the spiral windings is very simple, which is different to the other known designs of transponder antenna arrangements: In the case of manufacture of the spiral windings of the antenna conductor track by printing, just the layout of the print-out format for the antenna conductor track needs to be altered. The same also applies for the case that the antenna conductor track is manufactured using an etching method. In this case, the layout, of an etch resist for example, should be adapted. The same applies for comparable methods such as the pattern-plating method. These adaptations are very easy to realize. Contrary to the conventional constructions of antenna arrangements, there are no additional operational steps necessary, for example through generation of the conductor structures on a plurality of levels of the carrier or of a plurality of carriers. Furthermore, also the danger of manipulation of a valuable and/or security document, into which the data transmission device according to the invention is integrated, through delamination or any other kind of ripping open of the document layers is reduced, since the splitting of the spiral windings into respectively a plurality of spiral winding branches makes it possible that the width of the spiral winding branches are designed smaller than the spiral windings in the single-track shape. In fact, for the design of the spiral windings, the quality of the antenna being maintained, the cross-section of the spiral windings that, by splitting into a plurality of branches, results from the sum of the cross-sections of the individual branches of a spiral winding is decisive. Based on the reduced width the adhesive strength of the carrier/the carrier layer of the data transmission device on an adjacent document layer in this case is improved since the adhesion between the plastic layers (the compensation layer, the carrier layer, other document layers) is greater than the adhesion between the material of the spiral windings/spiral winding branches and the plastic of the document layers. One should also note that the cross-section of the antenna conductor track has an influence on its electrical resistance. Particularly for the formation of the antenna conductor track with a conducting paste or a conducting varnish, a relatively high electrical resistance results which leads to lowering of the responsiveness of the circuit element. Therefore, the cross-section of the conductor track (height, width), in particular in the last case, should be as large as possible.

A single-track spiral winding passes over into the multi-track spiral winding with a plurality of spiral winding branches at the branching points. In this way the spiral winding spreads out locally in the transition area. This transition area can be designed to gradually widen, more or less funnel-shaped, in that the spiral winding branches are continuously guided out of the single-track spiral winding area, or the transition area can be designed as steps in that one or a plurality of the spiral winding branches is led out of the single-track spiral winding area at a specified location stepwise over the course of the spiral winding. In a further alternative the branching can take place in the form of a right-angled branching. The first case mentioned is preferred since the conductor track has a much lower tendency towards forming cracks under mechanical or thermal loading since mechanical tension peaks are avoided.

The antenna conductor track has a respective terminal contact at the ends thereof which serves, in the mounting region, to achieve electrical contacting with the electronic component. The terminal contacts can be made from the same material and by using the same process technology as used for the antenna conductor track.

A process with the following method steps is provided for manufacture of the contactless data transmission device according to the invention:
  i) providing the carrier;
  ii) printing the antenna conductor track being formed as at least one spiral winding, for example using screen printing, gravure printing or flexo printing, including the terminal contacts of the antenna conductor track preferably at the ends of the spiral windings on the carrier, such that at least one spiral winding is split between two respective branching points to form at least two spiral winding branches preferably outside the mounting region of the chip;
  iii) placing the electronic component, in particular using the flip-chip technique, above the antenna conductor track, so that the contact points of the electronic component lie opposite to the terminal contacts, and mechanical fastening and contacting of the component with the antenna conductor track.

In step ii) the mentioned printing methods are characterized by a relatively high application of paint. In this way printed antennae with a comparatively high quality are obtained on the basis of a comparatively low electrical resistance. Gravure printing can, in particular, be in the forms of line gravure printing or photogravure printing. Screen printing, preferably in the form of sheet screen printing or rotary screen printing, is the preferred printing method.

In a preferred further development of the present invention, the at least one spiral winding runs between at least two contact points of the electronic component, i.e., the spiral windings are guided under the component or above this by crossing the component. This serves to allow bringing the ends of the antenna conductor track in contact with the contact points of the component, without a crossing guide of a spiral winding going over other spiral windings or under others being necessary. This, in a preferred development of the present invention, leads to an arrangement of the electronic component bridging the strand of spiral windings. The single-track spiral windings can have a smaller distance between them in the mounting region of the electronic component than outside the mounting region in order to guide the windings between the contact points of the component. In this area, the spiral windings can particularly run parallel to one another. In order to allow a simplified guide for the spiral windings between the contact points of the component, it can be desirable to reduce the number of the single-track spiral windings to a minimum. This goal will, however, by lowering the inductance of the antenna and therefore increasing the resonance frequency of the data transmission device so that, in this case, adaptation of the resonance frequency is necessary to the prescribed value in another way. This can, for example, be reached by an additional electrical capacity connected in parallel.

In another preferred development of the present invention, the spiral winding branches of the antenna conductor track are designed to run with a constant width, for example with a width of 50 μm to 2 mm, wherein a width in a range of from 100 μm to 350 μm and, more particular, of about 200 μm is particularly preferred. It is furthermore preferred that the spiral winding branches of the antenna conductor track and the single-track areas of the spiral windings running in the mounting region are equally wide. The distance between adjacent spiral winding branches of a spiral winding preferably remains constant over the whole run between two branching points and is, for example, 50 μm to 2 mm, preferably 100 μm to 350 μm and more particularly is preferably about 200 μm. In a particularly preferred development of the present invention, the distance between all adjacent spiral winding branches of a spiral winding is the same. In the same way the distance between adjacent spiral windings or the spiral winding branches of adjacent spiral windings can be held constant over the whole course of a winding. A particularly preferred distance between the spiral winding branches of all adjacent spiral winding branches is 50 μm to 2 mm, preferably 100 μm to 350 μm and is particularly preferred about 200 μm.

This development of the present invention has a process-technical advantage if the circuit element is manufactured using screen printing technology, which is particularly advantageous due to its reliability and low costs. If the spiral windings/spiral winding branches, in this case, were namely manufactured with a varying width, then it is possible that the same height of conductor track sections does not arise everywhere. This is due to the printing conditions. During generation of the antenna conductor track with a constant width in the whole layout it is possible, on the other hand, for a constant thickness to be achieved at all locations of the conductor track, so that the cross-section and consequently the electrical resistance is constant at all locations of the conductor track. This leads to a significant improvement in the quality of the conductor track.

If the antenna conductor track is formed with a conductive paste or a conductive varnish, then the electrical resistance of the conductor track can be lowered through subsequent compression, for example in the mounting region of the chip. This can, in particular, be achieved by applying pressure using a stamp to the conductor track.

In a further preferred development of the present invention, the electronic component is, in particular, a semiconductor component. The semiconductor component can be formed by an unhoused semiconductor chip (bare die). This allows further cost reductions for manufacture of the contactless data transmission device according to the invention since the chip does not initially have to be mounted in a module. As an alternative, the component can, however, also be a housed component, for example a Surface Mount Device (SMD) or a Chip Scale Package (CSP), or be in one of the following housing forms: DIP, TQFP, MLF, SOTP, SOT, PLCC, QFN, SSOT, BGA, MOB, or other usual housing forms. Furthermore, one can also use a sub-module as a chip carrier based on flexible circuit boards (interposa) made from polyimide, FR4, PC, thin glass. The electronic component has at least two contact points, which are arranged on the contacting side of the component at opposing sides of an edge of the element.

In a further preferred development of the present invention, the semiconductor chip is mounted on the antenna conductor track according to the flip-chip technique. This technique includes the fact that the chip is mounted (mechanically and electrically connected) at its contact points via contact bumps with the contacting side of the chip being oriented downwards onto the antenna conductor track. To this effect, one uses an anisotropic conductive adhesive typically, which fills the whole space between the contacting side of the chip and the side of the carrier on which the antenna conductor track is located. This adhesive has the property of only creating an electrical contact in those areas in which the contact surfaces that are to be brought into contact with one another come very close to one another or even touch one another. Application of pressure to the adhesive surface creates the anisotropy of the electrical conductivity. As an alternative, one can also work without an adhesive and the chip can be connected with the connecting contacts under pressure at an elevated temperature. As a further alternative, the electronic component can, in particular, be mounted according to the flip-chip technique using solder in that the contact bumps of the chip are, for example, formed by solder bumps (collapsed solder bumps). Particularly preferred is contacting of the chip both by using an anisotropic conductive adhesive and by a collapsed solder surrounded by the anisotropic conductive adhesive. This allows a very good electrical conductivity and good mechanical properties. As an alternative, the contact bumps can also be formed from nickel with gold plating or from palladium. In this case the chip mounting exclusively takes place using the anisotropic conductive adhesive. The anisotropic conductive adhesive can, for example, be applied using a dispenser or by printing on the carrier or the spiral windings.

The positions of the contact bumps of the component and the connecting contacts of the antenna conductor track should be arranged relative to one another for mounting of the electronic component on the antenna conductor track in such a way that, for suitable alignment of the component, for example a chip, relative to the antenna conductor track, they can stand directly opposite to one another and therefore come close to one another, i.e., practically touch one another. This mounting method is very simple and reliable to use.

In an alternative embodiment of the present invention, the electronic component can be embedded in the carrier, for example, by generating a recess in the carrier and by gluing in the element into this recess in an orientation in which the contacting side with the contact points of the component points upwards so that the contacting side is aligned with the carrier surface. The antenna conductor track is subsequently generated on the contacting side of the component and the carrier surface, for example by printing it on. The spiral windings of the antenna conductor track are also, in this case, guided through between the contact points of the electronic component.

In a further preferred development of the present invention, at least two of the at least two spiral winding branches of the at least one spiral winding are additionally connected together between the branching points by at least one respective electrical connecting element. These connecting elements can be formed by conductor track sections, which extend between the adjacent spiral windings/spiral winding branches. They can be applied at a plurality of locations between two adjacent spiral winding branches or only at one location. Such connecting elements can be provided between spiral winding branches of one spiral winding or also between spiral winding branches of a plurality of spiral windings. They can be designed to have the same width as the spiral windings/spiral winding branches or to be narrower or wider. They can have a constant width over their connecting length or a variable width. They can initially be formed by a plurality, for example, two sections which are separated from each other by a gap, which is bridged in an electrically conductive manner for subsequent adaptation of the electrical properties of the circuit element, so that a connecting element arises. The electrical connecting elements can alternatively also be made continuously conductive between the adjacent spiral winding branches and then can be cut through as required for adaptation of the electrical properties of the circuit element. The connecting elements increase the inductance of the antenna of the circuit element and thus lower the resonance frequency of the data transmission device. The greater the number of connecting elements, the greater is the inductance.

In a further preferred development of the present invention, the circuit element also has a capacitive circuit element. The capacitive circuit element is preferably connected in parallel to the antenna conductor track and therefore also to the capacity of the electronic component and therefore lowers the resonance frequency of the data transmission device. To this effect, one basically needs a separate component in the form of a capacitor with which, for example, the carrier of the data transmission device is picked and placed and with which the antenna conductor track is connected electrically. As an alternative, a capacity can also be generated by two electrically conductive surfaces on the carrier separated by a dielectric, for example by a plurality of screen printing steps. This alternative, however, requires a high outlay.

A lot more advantageous is a development of the present invention according to which the capacitive circuit element is formed by at least one blind conductor track, which is electrically connected with one end respectively of a terminal contact of the antenna conductor track. The other end of the blind conductor track is an open end. This blind conductor track can be formed like the antenna conductor track on the carrier, preferably using the same technology, for example by means of screen printing.

These blind conductor tracks can preferably be guided, starting from the terminal contacts of the antenna conductor track, along the spiral windings/spiral winding branches of the antenna conductor track. In a first case, an outer blind conductor track can start from an outer lying terminal contact on the antenna conductor track and continue parallel to the outer spiral winding/outer spiral winding branch of the antenna conductor track. In a second case, an inner blind conductor track can start from an inner lying terminal contact on the antenna conductor track and continue parallel to the inner spiral winding/inner spiral winding branch of the antenna conductor track. In a third case, it is possible that such an outer blind conductor track as well as such an inner blind conductor track are provided.

The outer and/or the inner blind conductor track can exclusively run over a smaller or larger part of an overall winding (about 360°) along the outer or inner antenna conductor track part or form more than one winding, for example 1.5 windings or two or three or even more windings. The outer blind conductor track can be longer than the inner blind conductor track and vice versa. Since the length of the blind conductor tracks increase the capacity of the circuit element due to parallel connecting with the antenna conductor track, and even more so the longer these conductor tracks are designed, there is an option presented for fine-tuning of the resonance frequency of the data transmission device in that the length of the blind conductor tracks is adjusted in such a way that a prescribed resonance frequency is achieved. This can, for example, be performed through generation of blind conductor tracks and their subsequent shortening, for example by cutting through at a suitable point, for example by ablation with a laser, mechanical removal through grinding, cutting or stamping, chemical removal or etching. This fine-tuning can, for example, be necessary for using various semiconductor chips (electronic components) with a different internal parallel capacity. Above all, this tuning process can also still be undertaken after mounting the electronic component so that capacity fluctuations which are caused by the component itself can be balanced out (trimming of the additional capacity of the blind conductor tracks).

The outer and/or the inner blind conductor track preferably follow the winding direction of the antenna conductor track, i.e., for an antenna conductor track which being wound from the outside to the inside anti-clockwise the inner blind conductor track, starting from the inner terminal contact, is also wound anti-clockwise, and the outer blind conductor track is wound in this case, starting from the outer terminal contact, clockwise. The same applies vice versa. The blind conductor tracks are preferably designed to be equally wide over their whole respective course. They preferably run at a close distance to the outer or inner spiral windings/spiral winding branches, for example at a distance of 50 μm to 2 mm, preferably 100 μm to 350 μm and particularly preferable is a distance of about 200 μm.

The circuit element is preferably formed in one plane of the document in that it is generated on the carrier. In this way the circuit element is generated in one working cycle.

In a further preferred development of the present invention, the antenna conductor track is manufactured from a conductive paste or a conductive varnish. This technology is simple and therefore economic to realize. The conductive paste or the conductive varnish contains at least one polymer as a binder as well as at least one metal and/or a conductive metal oxide and/or another conductive material in the polymer. As a conductive material one can use copper, silver, gold, iron, zinc, tin or carbon, in particular graphite, single wall and/or multiwall nanotubes, fullerenes or graphenes. The metal oxide can be ITO (indium tin oxide), IZO, FTO (tin dioxide doped with fluorine), ATO (antimony oxide). The metals/metal oxides can be present in the form of flakes, needles, powder (in particular nanosized), platelets or the like. They are in particular present as aggregated particles. Other conductive materials can be conductive organic materials/polymers, for example polyaniline, PEDOT:PSS. A screen printing system can be used for generation of the circuit element with the conductive paste or the conductive varnish, for example sheet-fed printing, or a reel-to-reel printing process. The thickness of the printed paste or the varnish can, in particular, be 1 μm to 100 μm and is particularly preferred about 10 μm. The conductive paste or the conductive varnish can either be simply dried or hardened using heat and/or irradiation with electromagnetic radiation, for example UV radiation.

The printing methods involving gravure printing can be used, in particular line gravure printing, also known as intaglio printing, as well as photogravure printing, flat printing, in particular offset printing, relief printing, in particular letter set, through-printing, in particular screen printing, flexo printing or digital printing methods, in particular inkjet printing. Screen printing, gravure printing as well as flexo printing are preferred; screen printing is particularly preferred.

The antenna conductor track can alternatively also be manufactured by another technique, for example be made out of aluminum or copper using an etching technique by means of an etching resist or in a pattern plating process. For the pattern plating process structures are initially formed as channels, based on a basic metallisation, for example from copper, with a plating resist on the basic metallisation. Then metal is additionally deposited in the channels galvanically. The basic metallisation is removed between the structures by etching after removal of the plating resist.

In a further preferred development of the present invention, intermediate spaces between the spiral winding branches, which are formed by the spacings between the spiral windings/spiral winding branches, are filled with a dielectric filler material with a dielectric constant, which differs from that of the carrier, in order to influence the electrical properties of the circuit element. For example it can be advantageous to use a filler material with a particularly high dielectric constant, for example one which is filled with barium titanate. As an alternative, it can also be desirable that the filler material has a particularly low dielectric constant. For example a filler material filled with a fluorinated polymer is a possible choice. The filler materials are at least in part formed by a binder which essentially consists of the same material as the carrier to ensure that the filler material enters into an intimate connection with the carrier material and other document material and therefore prevents the document from being pulled apart after lamination or casting, for example through delamination. This material can, for example, be applied through coating with a doctor knife or by screen printing on the carrier provided with the circuit element. The layer formed in this way can also be used instead of a compensation layer for the electronic component.

The document can be made from a polymer which is selected from a group, including polycarbonate (PC), in particular bisphenol A-polycarbonate, polyethylenterephthalate (PET), its derivatives such as glycol-modified PET (PETG), polyethylennaphthalate (PEN), polyvinylchloride (PVC), polyvinylbutyral (PVB), polymethylmethacrylate (PMMA), polyimide (PI), polyvinylalcohol (PVA), polystyrene (PS), polyvinylphenol (PVP), polypropylene (PP), polyethylene (PE), thermoplastic elastomers (TPE), in particular thermoplastic polyurethane (TPU), acrylnitrile butadiene styrene copolymer (ABS) as well as its derivatives, and/or paper.

The document can also be made from a plurality of these materials. The document preferably consists of PC or PC/TPU/PC. The polymers can be present either filled or unfilled. In the latter case they are preferably transparent or translucent. The polymers are opaque if they are filled. The filler material can, for example, be a pigment or a filler material which has a particularly high or a particularly low dielectric constant. The electrical properties of the circuit element can be influenced by a suitable choice of filler material. The document is preferably made from 3 to 12, preferably 4 to 10 foils (including the carrier for the data transmission device).

The document can in particular be made from these materials through lamination. The lamination will typically be made from PC in a laminating press at 170 to 200° C. and at a pressure of 50 to 600 N/cm$^2$.

According to a further preferred development of the present invention, the document according to the invention has a display device (display). The display device is preferably arranged on a document layer different to the carrier. This device can, for example, be a bi-stable display device, an electrophoretic display device, an electrochromic display device, a liquid crystal display device (LCD), an LED display device, in particular an inorganic LED or organic LED display device (OLED), a bi-stable LCD display device, for example a twisted nematic, super twisted nematic, cholesteric or nematic LCD display device, a turning element display device, bar display device, photoluminescent erasure indicator or a display device on the basis of the electrowetting effect or a hybrid display device. It can, in particular, be a flexible, bi-stable display device. Such display devices are known, for example, from US 2006/0250534 A1. Further bi-stable display devices are known, for example, from WO 99/53371 A1 and EP 1 715 374 A1. Bi-stable display devices are also called "Electronic Paper Display" (EPD). The electronic component is designed to control the display device. To this effect, it can have an electronic memory for storage of image data which are displayed on the display device due to coupling in of the electrical energy. The electronic component can furthermore have an internal driver for the display device or at least one additional external component is used, for example a driver.

The electronic component and also possibly the display device, can be supplied with energy via the antenna (passive transponder). As an alternative, a separate antenna arrangement or a battery can be provided for this.

BRIEF DESCRIPTION OF THE DRAWING FIGURES

The invention will be further illustrated exemplarily on the basis of the figures.

DETAILED DESCRIPTION OF THE INVENTION

The same reference numbers in the figures designate to elements with the same function.

Figure 1:
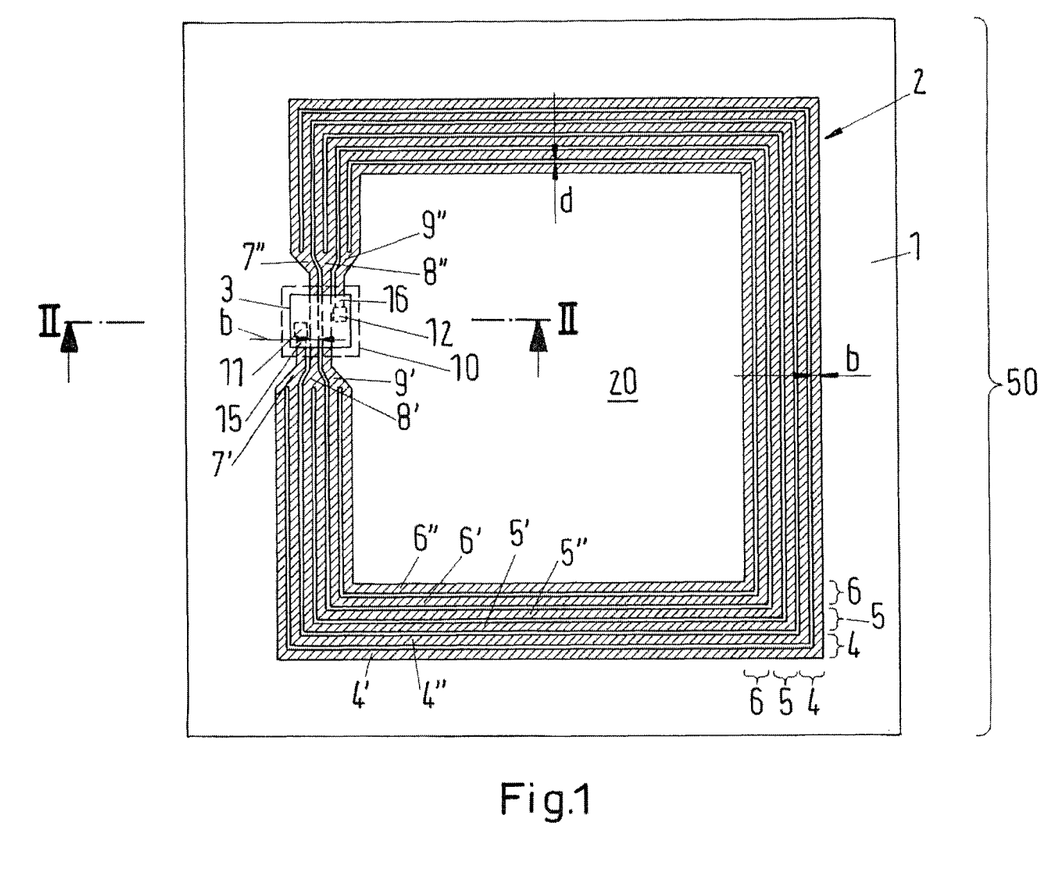
FIG. 1 shows a data transmission device according to the invention according to a first embodiment in a schematic top view.

The contactless data transmission device 50 according to the invention according to FIG. 1 consists of a carrier 1 on which an antenna conductor track 2 and an electronic component 3, for example an unhoused chip, are arranged. The chip 3 is fastened in a mounting region 10 onto the carrier 1. The antenna conductor track 2 forms a circuit element.

The carrier 1 is, for example, formed by a transparent (unfilled) polycarbonate film with a thickness of 80 μm. A continuous spiral-shaped antenna conductor track 2 is arranged on the polycarbonate film with spiral windings 4, 5, 6 which run parallel to one another. Each of the spiral windings 4, 5, 6 respectively forms four winding sections, which extend perpendicularly to one another, which surround an antenna inner area 20. Each of these spiral windings 4, 5, 6 is respectively split into two spiral winding branches 4', 4" or 5', 5" or 6', 6" so that the spiral windings run in a two-track manner in these areas. A first spiral winding 4 splits at the branching points 7', 7" into the spiral winding branches 4', 4", a second spiral winding 5 at the branching points 8', 8" into the spiral winding branches 5', 5" and a third spiral winding 6 at the branching points 9', 9" into the spiral winding branches 6', 6". The spiral windings 4, 5, 6 run in a single-track manner in the mounting region 10 of the chip 3. The spiral windings 4, 5, 6 run outside the mounting region 10 in a short distance d parallel to one another. This distance d can be 200 μm for example. The distance between the single-track sections of the spiral windings 4, 5, 6 can be still lower within the mounting region 10, i.e., under the chip 3, since the spiral windings must be passed through at this location between the contact points 11, 12 of the chip 3.

The chip 3 is mounted according to the flip-chip technique on the carrier 1 for its electrical contacting. To this effect, its contact points 11, 12 are designed in the form of contact bumps congruently to the contact connections 15, 16 of the antenna conductor track 2, i.e., at a distance which corresponds to the distance between the contact points 11, 12 of the chip 3. The chip 3 can, for example, be glued by means of an anisotropic adhesive to the carrier 1 in order to anchor this there mechanically and to create an electrical contact between the contact bumps 11, 12 and the contact connections 15, 16.

The antenna conductor track 2 starts at a first contact connection 15, which is in electrical contact with a first contact bump 11 of the chip 3. From there, the first spiral winding 4 extends anti-clockwise over a first branching point 7', at which two first spiral winding branches 4', 4" running parallel to one another are formed from the single-track first spiral winding 4. These two first spiral winding branches 4', 4" come together again at a second branching point 7" after one circulation (360°) so that the first spiral winding 4 is single-track again. The antenna conductor track 2 then crosses the mounting region 10 of the chip 3 and does this by running under the chip. After leaving the mounting region 10, this now second spiral winding 5 branches at the first branching point 8' while forming a two-track second spiral winding, which is formed by the two second spiral winding branches 5', 5". These branches 5', 5" again run parallel to each other and anti-clockwise parallel to the first spiral winding branches 4', 4", namely within the antenna area 20 formed from these. After a full circulation of the second spiral winding branches 5', 5" these unite again at the second branching point 8" while forming the single-track second spiral winding 5. After passing across the mounting region 10 under the chip 3 the second spiral winding 5 passes over into the third spiral winding 6 which splits at the first branching point 9' into two third spiral winding branches 6', 6", wherein a two-track third spiral winding is formed. After another full circulation within the antenna area 20 formed by the first spiral winding branches 4', 4" and the second spiral winding branches 5', 5", the third two-track spiral winding 6 reaches the second branching point 9" where both branches 6', 6" unite together again and form the single-track third spiral winding 6. This ends in the mounting region 10 under the chip 3 in a second terminal contact 16, which is connected electrically with a contact point 12 of the chip formed by a contact bump.

The width b of the spiral winding branches 4', 4", 5', 5", 6', 6" is constant over their whole course and exactly the same as the width of the single-track sections of the spiral windings 4, 5, 6 in the mounting region 10 under the chip 3. This width b is 250 μm for example.

Figure 2:
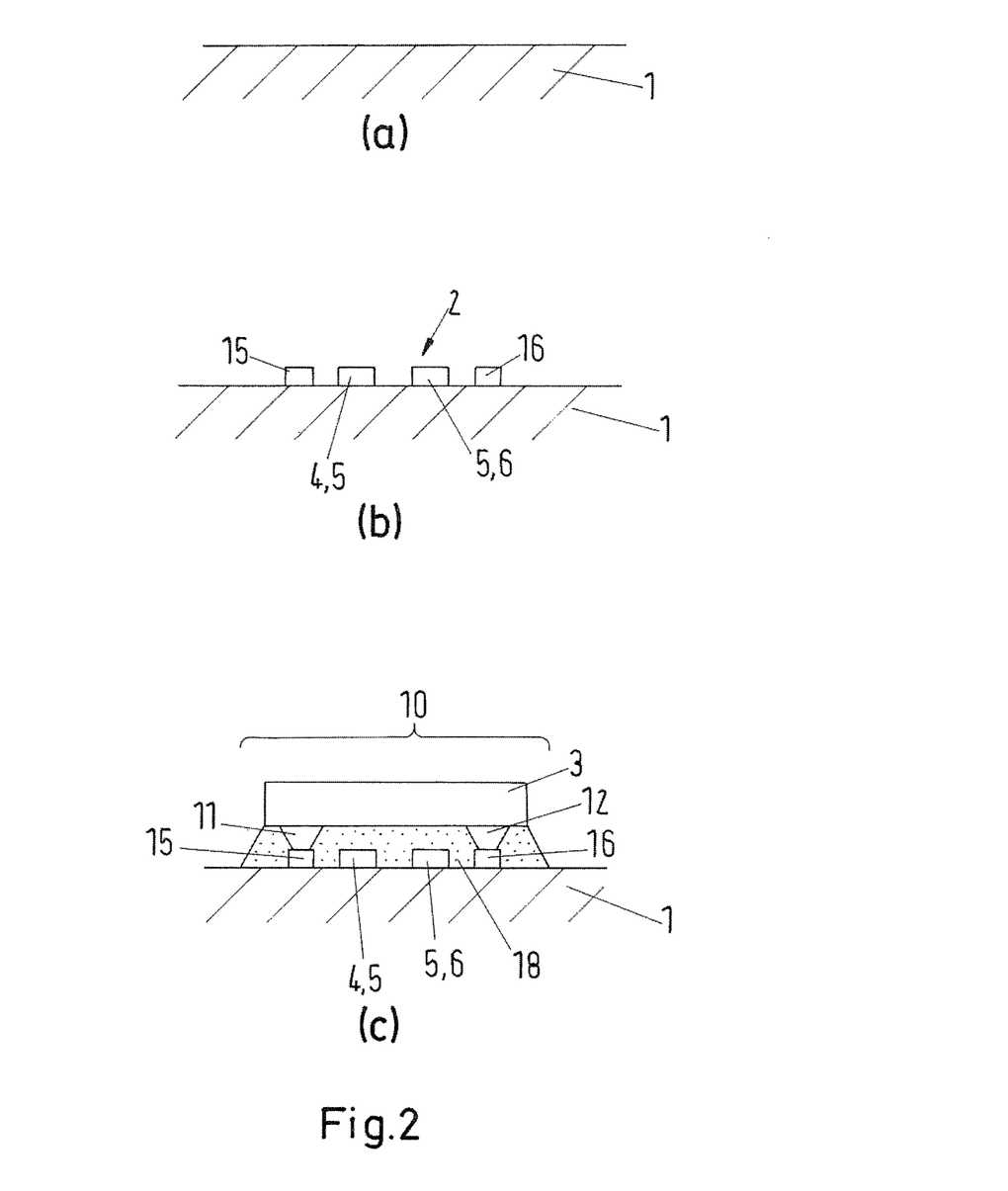
FIG. 2 shows the method steps for the manufacture of the data transmission device according to the invention according to the first embodiment in schematic cross-sectional views; (a) provision of the carrier; (b) printing of the spiral-shaped antenna conductor track including the terminal contacts of the antenna conductor track on the carrier; (c) placing of the chip over the antenna conductor track.

FIG. 2 shows the process for manufacture of the data transmission device 50 according to the invention from FIG. 1 in a schematic representation in cross-sections according to II-II (see FIG. 1).

In a first method step the carrier 1 is provided at first (FIG. 2a). In a second method step the antenna conductor track 2 consisting of the spiral windings 4, 5, 6 and the terminal contacts 15, 16, is generated on the carrier 1, for example by printing the antenna structure with a silver conductive paste using screen printing (FIG. 2b). The chip 3 is mounted in a third method step. The chip 3 has contact points 11, 12 in the form of contact bumps, for example ones made from copper/nickel/gold, which are brought into electrical contact with the terminal contacts 15, 16 of the antenna conductor track 2. To this effect, the chip 3 is placed with the contact bumps 11, 12 on the terminal contacts 15, 16. To achieve mounting of the chip in the mounting region 10 an anisotropic conductive adhesive 18 is first applied in an exact quantity, as for example from a dispenser, to the carrier 1 and the antenna conductor track 2. This conductive adhesive 18 contains very small conductive metal particles which create an electrical contact between the contact bumps 11, 12 of the chip and the connection contacts 15, 16. Furthermore, the conductive adhesive 18 fixes the chip 3 mechanically onto the carrier 1.

Figure 3:
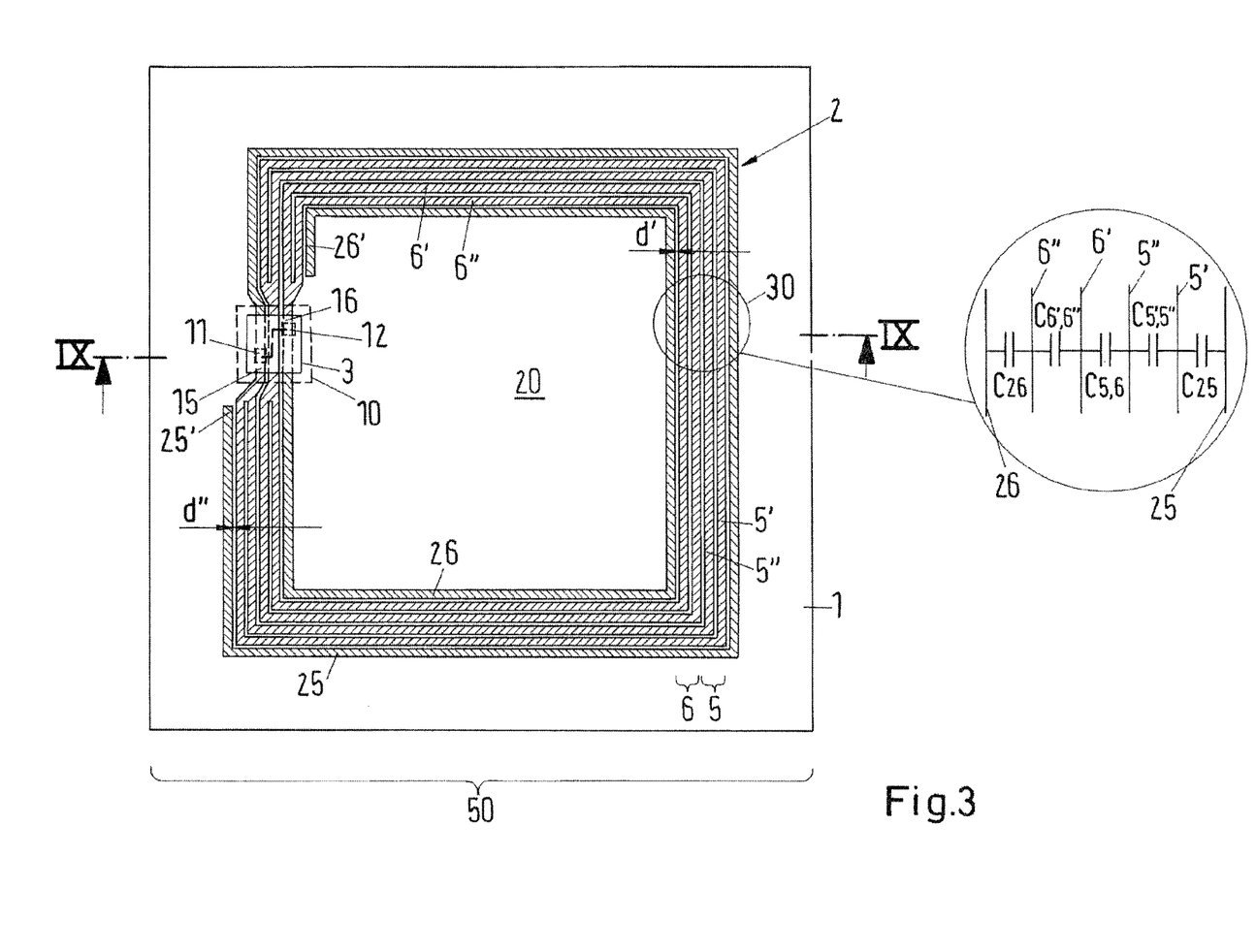
FIG. 3 shows a data transmission device according to the invention according to a second embodiment in a schematic top view.

A second embodiment of the data transmission device 50 according to the invention is shown in FIG. 3. This differs from the first embodiment represented in FIG. 1 in that, on the one hand, the antenna conductor track 2 has two spiral windings 5, 6 instead of three spiral windings and that, on the other hand, there are two additional blind conductor tracks 25, 26 provided. The antenna conductor track 2 and the blind conductor tracks 25, 26 together form the circuit element of the contactless data transmission device 50.

There is an equivalent circuit diagram reproduced for the electrical capacities between the spiral windings 5, 6 and the blind conductor tracks 25, 26 on the right next to the representation of the data transmission device 50 according to the invention.

The inductance of the antenna conductor track 2 is reduced through the reduction in the number of spiral windings 5, 6 from three to two. This increases the resonance frequency of the data transmission device 50. In order to again reduce the resonance frequency to a prescribed value the blind conductor tracks 25, 26 are additionally provided which form additional capacities $C_{25}$, $C_{26}$ with the antenna conductor track 2. There are also the capacities shown in the equivalent circuit diagram which respectively form between the spiral windings 5, 6 ($C_{5,6}$), on the one hand, and between the first spiral winding branches ($C_{5',5''}$) and the second spiral winding branches ($C_{6',6''}$) on the other hand. The capacities between the respective spiral winding branches ($C_{5',5'''}$, $C_{6',6'''}$) are very small. However, the capacity $C_{5,6}$ between the two spiral windings 5, 6 is not negligible.

The blind conductor tracks 25, 26 continue the antenna conductor track 2 at the terminal contacts 15, 16 and do this in the same winding direction in which the antenna conductor track 2 is also wound. The blind conductor tracks 25, 26 run parallel to the spiral windings 5, 6 and at a small distance d', d'' to them.

The blind conductor tracks 25, 26 do not contribute to the inductance of the circuit element, or do only insignificantly, since they respectively end in a free end 25', 26'. Additional capacities $C_{25}$, $C_{26}$ are formed due to the parallel tracks of the inner blind conductor track 26 with the inner spiral winding 6 and of the outer blind conductor track 25 with the outer spiral winding 5 which are connected in parallel to the capacity $C_{5,6}$ and the capacity of the chip 3 and therefore increase the capacity of the circuit element overall. This lowers the resonance frequency of the data transmission device 50.

The blind conductor tracks 25, 26 can be made respectively shorter and/or longer than is shown in FIG. 3. For example, the outer blind conductor track 25 does not have to be designed as just forming one winding but can, for example, form two or even more windings. The same also applies for the inner blind conductor track 26. As an alternative, the outer blind conductor track 25 and/or the inner blind conductor track 26 can also respectively exist in a shorter winding and, for example, just form a half winding parallel to the antenna conductor track 2. One of the two blind conductor tracks 25, 26 can naturally also realize one or more full windings and the other just a fraction of a winding. Or one blind conductor track or both blind conductor tracks 25, 26 can additionally also have a fraction of a further winding in addition to one or more windings. It has been shown that formation of a full first winding of the inner blind conductor track 26 leads to additional lowering of the resonance frequency by 0.5 MHz, for example, while formation of a full first winding of the outside blind conductor track 25 leads to lowering of the resonance frequency by 0.25 MHz, for example. Every additional winding has a smaller effect on lowering the resonance frequency. However, the values quoted for these respective increments also depend on further parameters.

Figure 4:
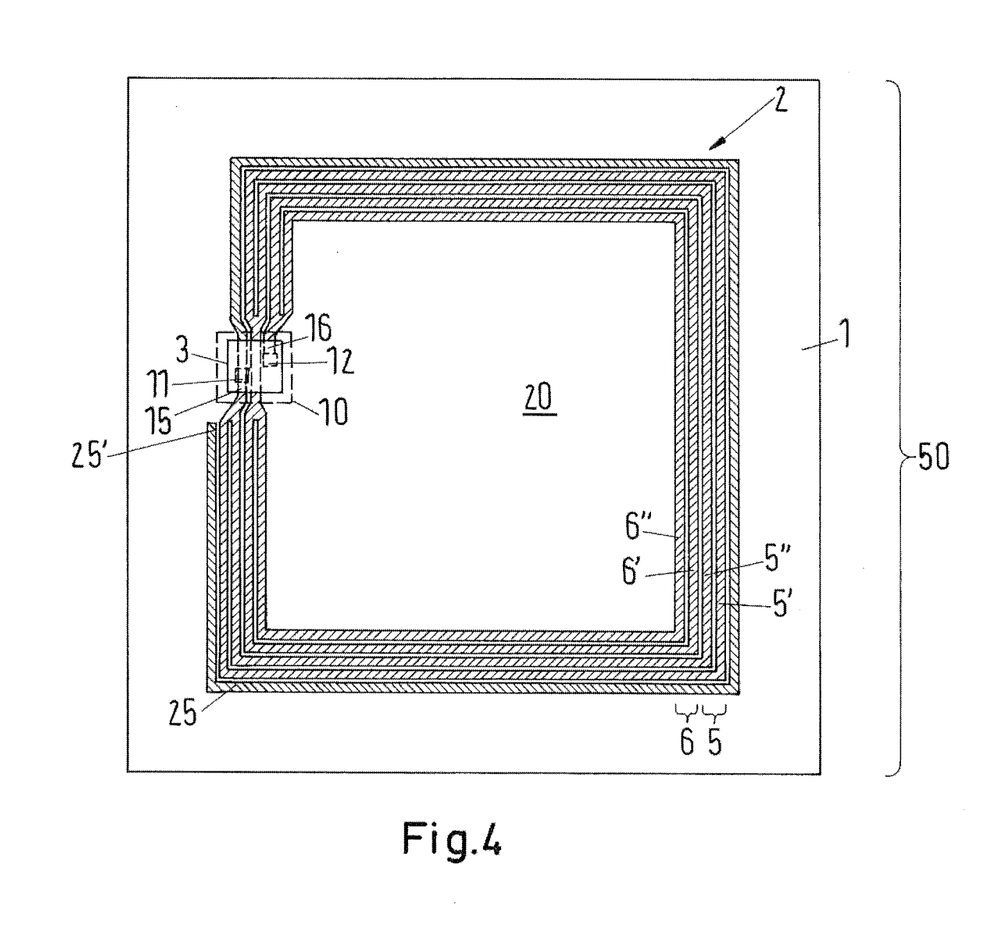
FIG. 4 shows a data transmission device according to the invention according to a third embodiment in a schematic top view.
Figure 5:
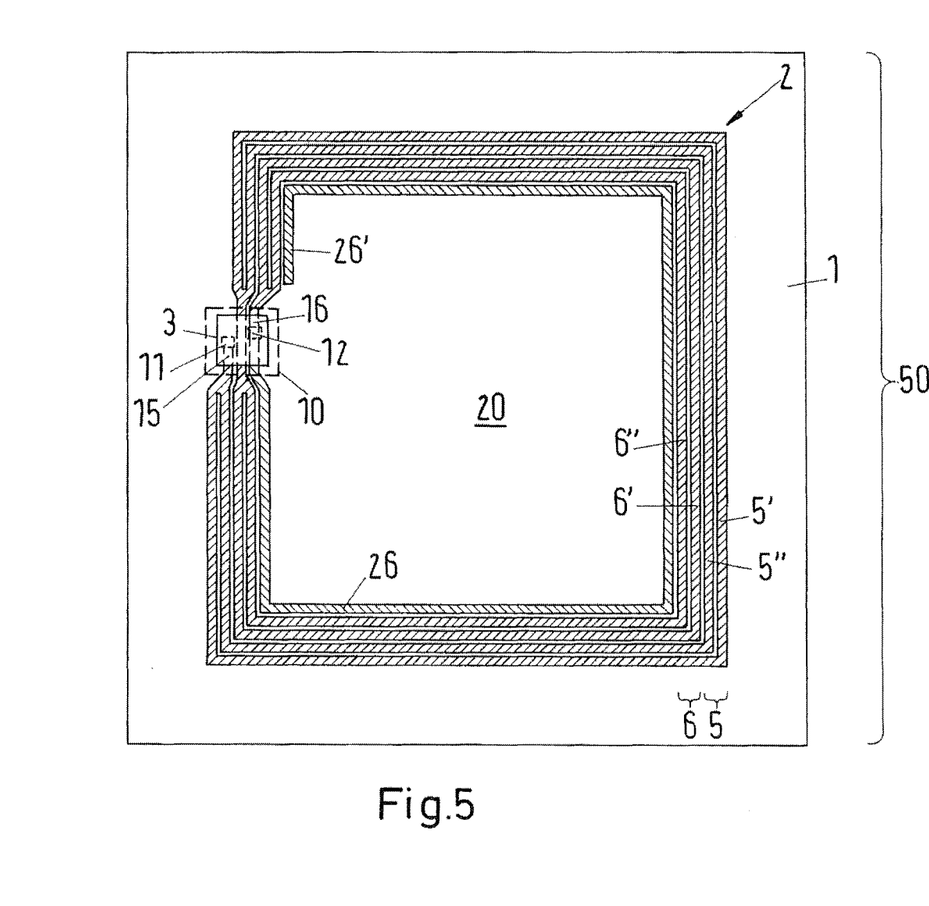
FIG. 5 shows a data transmission device according to the invention according to a fourth embodiment in a schematic top view.

As an alternative to the embodiment shown in FIG. 3, the circuit element can also exclusively have an outer blind conductor track 25 (FIG. 4; third embodiment) or exclusively have an inner blind conductor track 26 (FIG. 5, fourth embodiment).

As an alternative, the inner blind conductor track 26 and/or the outer blind conductor track 25 can also already be branched off before running of the respective spiral windings 5, 6 into the mounting region 10 of the chip 3 and be guided past the mounting region of the chip into the corresponding blind conductor track, which is shown in FIG. 3, 4, 5.

The capacitive contribution of the blind conductor tracks 25, 26 for fine-tuning of the overall capacity of the circuit element can be fine-tuned by adjusting their length subsequently. This is also still then possible when the chip 3 has already been mounted so that the fluctuations of the resonance frequency caused by the chip can be balanced out in this way. For example, the blind conductor tracks 25, 26 can at first be created in the respectively prescribed number of windings which run parallel to the inner spiral winding 6 or the outer spiral winding 5, respectively, and then are shortened as required. This can, for example, be realized through cutting off of the blind conductor tracks 25, 26 at a suitable location, for example by laser ablation, so that a shorter blind conductor track is obtained. As an alternative, also a number of inner and/or outer blind conductor track sections, which are not connected with one another, can be created at first, which are then connected together as required through bridging of respective interruptions present between the sections so that the respective blind conductor tracks 25, 26 are created in the arrangement shown in FIG. 3, 4, 5. These bridgings can be realized through application of a conductive varnish or a conductive paste to the interruptions.

Figure 6:
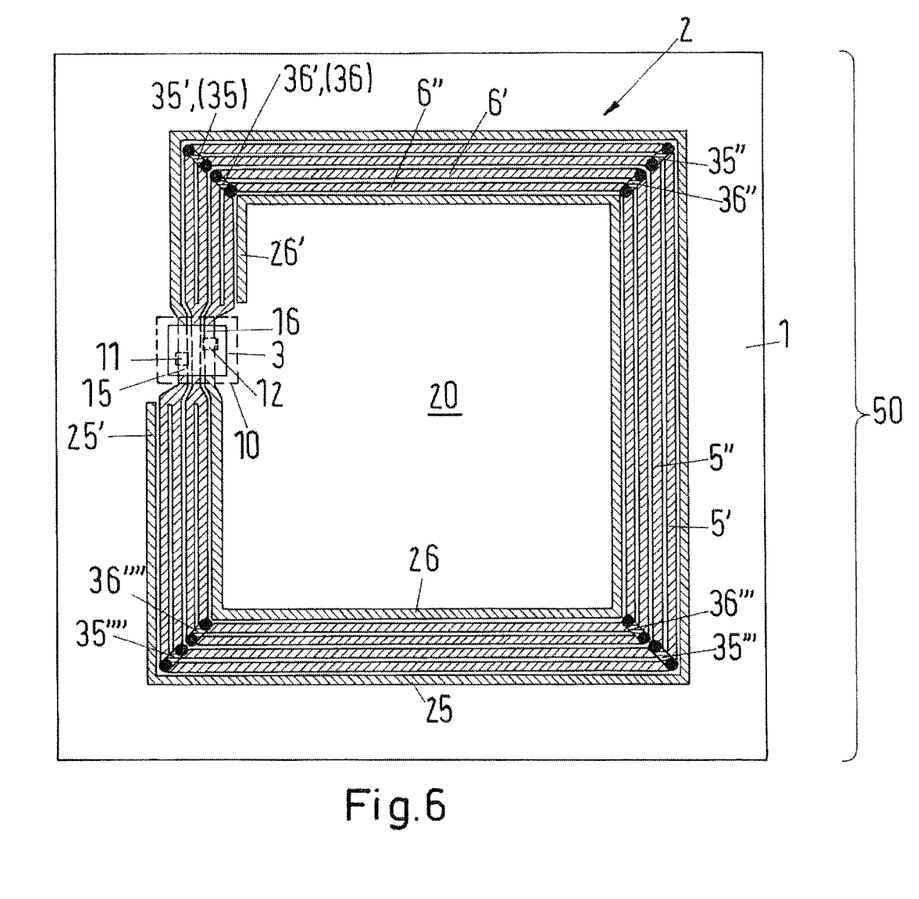
FIG. 6 shows a data transmission device according to the invention according to a fifth embodiment in a schematic top view.

The fifth embodiment of a data transmission device 50 according to the invention shown in FIG. 6 differs from the one shown in FIG. 3 in that there are additionally provided a plurality (two, three, four or even more) connecting elements 35', 35'', 35''', 35'''', 36', 36'', 36''', 36'''' (35, 36) between the spiral winding branches 5', 5'' or 6', 6'', respectively, or alternatively just one respective connecting element. These connecting elements 35, 36 short circuit the respective spiral winding branches 5', 5'', 6', 6'' at the corresponding locations and lead to the situation that the inductance of the antenna conductor track 2 is increased and therefore the resonance frequency of the circuit element is reduced. The resonance frequency can be reduced through increasing the number of connecting elements 35, 36 and through their reduction be increased. The connecting elements 35, 36 can also be provided at other locations than at the locations shown in FIG. 6. The connecting elements 35, 36 have preferably exactly the same width as the spiral winding branches 5', 5'', 6', 6''.

As an alternative to the embodiment shown in FIG. 6, the outer and the inner blind conductor track 25, 26 can naturally be as a whole or also individually left out.

Figure 7:
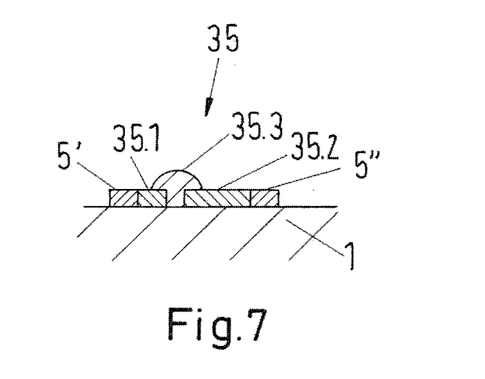
FIG. 7 shows a data transmission device according to the invention according to a sixth embodiment in a schematic cross sectional view.

It is therefore possible, through suitable arrangement of the connecting elements 35, 36, to fine-tune the resonance frequency. In order to perform this tuning without any problems, connecting elements 35, 36 can be provided which are formed by connecting element sections at first separated from one another. To trim the resonance frequency the interruptions between these sections can be bridged using conductive paste as required. For this, an example is shown in FIG. 7: The connecting element 35 between the spiral winding branches 5' and 5" was generated at first in two sections 35.1 and 35.2, for example by screen printing with a conductive paste. In order to fine-tune the data transmission device 50 these sections 35.1, 35.2 were connected together by a conductive bridge 35.3, for example through application of a conductive varnish or a conductive paste on the interruption. As an alternative, an existing connecting element 35, 36 can also be removed by cutting through, for example by means of laser ablation. As an alternative, the connecting elements 35 can also subsequently be fully generated by means of application of a conductive paste or a conductive varnish, in particular if the distance between the adjacent spiral winding branches is small.

Figure 8:
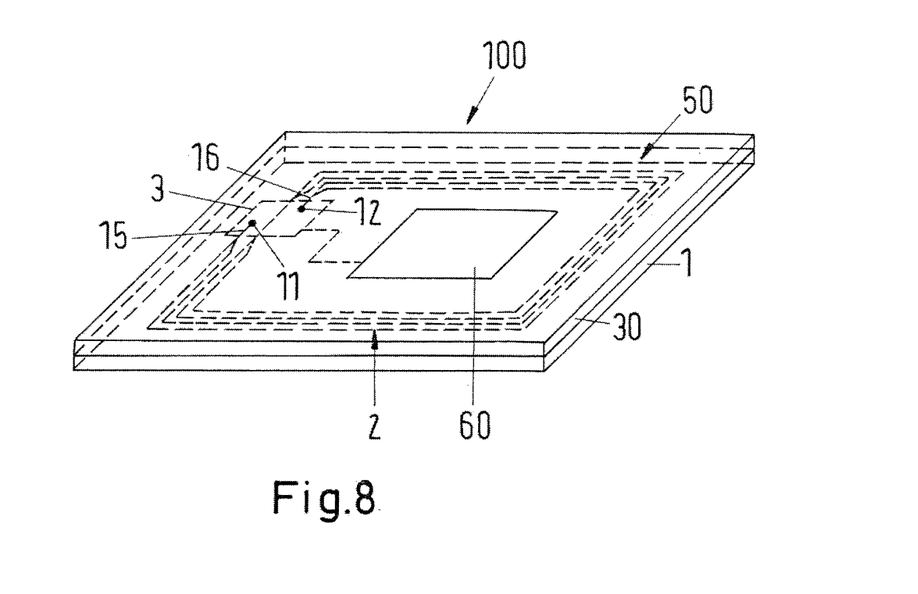
FIG. 8 shows a valuable and/or security document according to the invention with a data transmission device according to the invention and a display device in a perspective view.

FIG. 8 shows a valuable and/or security document 100 according to the invention in the form of a card with a contactless data transmission device 50 according to the invention in a perspective view. The data transmission device 50 is formed by a carrier 1, a circuit element which is formed by an antenna conductor track 2 and possibly also blind conductor tracks (not shown here), as well as an unhoused chip 3. The chip 3 is connected via contact points 11, 12 with the connection contacts 15, 16 of the antenna conductor track 2. Furthermore, the document 100 has a display element 60 which is connected with the chip 3. The carrier 1 with the circuit element and the chip 3 forms one of a number of document layers of the document 100. These document layers are laminated together under elevated pressure and elevated temperature, in order to form a monolithic document body. One of the further document layers is a compensation layer 30 which has a recess at the location at which the chip 3 is arranged (not shown) and which is arranged on the carrier 1 on that side on which the chip is mounted. The carrier 1 and the further document layers preferably consist of the same polymer, for example PC, and are transparent in part (overlays) and opaque in part, so that, for example, the data transmission device 50 is not visible from the outside.

Figure 9:
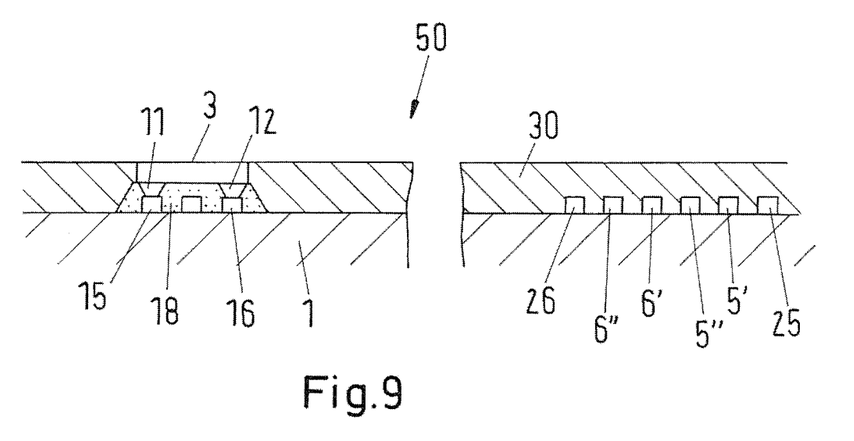
FIG. 9 shows a data transmission device according to the invention according to a seventh embodiment in a schematic cross sectional view.

The seventh embodiment shown in FIG. 9 is presented as a cross-section through the data transmission device 50 from FIG. 3, wherein additionally a material with a high dielectric constant is applied to the mounting side of the carrier 1 after generation of the circuit element and mounting of the chip 3. This material forms a layer 30 whose thickness essentially corresponds to the mounting height of the chip 3. This layer can therefore be used as a compensation layer. The material contains barium titanate to increase the dielectric constant.

The invention claimed is:

1. Contactless data transmission device (50) which comprises:
    an electrically insulating carrier (1),
    a circuit element arranged on the carrier (1), wherein the circuit element comprises a continuous antenna conductor track (2) in the form of at least one spiral winding (4, 5, 6) and respectively one terminal contact (15, 16) at the ends thereof, and
    an electronic component (3) electrically connected with the circuit element with at least two contact points (11, 12), wherein the electronic component (3) is placed in a mounting region (10) above the at least one spiral winding (4, 5, 6) and wherein the at least two contact points (11, 12) of the electronic component (3) are electrically connected with a respective terminal contact (15, 16) of the antenna conductor track (2),
    wherein at least one spiral winding (4, 5, 6) is branched outside the mounting region (10) between two respective branching points (7', 7"; 8', 8"; 9', 9") into at least two spiral winding branches (4', 4"; 5', 5"; 6', 6"),
characterized in that the circuit element furthermore comprises a capacitive circuit element and that the capacitive circuit element is formed by at least one blind conductor track (25, 26) which is respectively electrically connected with the terminal contact (15, 16) of the antenna conductor track (2).

2. The contactless data transmission device (50) according to claim 1, characterized in that the at least one spiral winding (4, 5, 6) runs through between at least two contact points (11, 12) of the electronic component (3).

3. The contactless data transmission device (50) according to claim 2, characterized in that the spiral winding branches (4', 4"; 5', 5"; 6', 6") of the antenna conductor track (2) are formed to run with a constant width (b).

4. The contactless data transmission device (50) according to claim 1, characterized in that the spiral winding branches (4', 4"; 5', 5"; 6', 6") of the antenna conductor track (2) are formed to run with a constant width (b).

5. The contactless data transmission device (50) according to claim 4, characterized in that the spiral winding branches (4', 4"; 5', 5"; 6', 6") of the antenna conductor track (2) and the areas of the spiral windings (4, 5, 6) running in the mounting region (10) are equally wide.

6. The contactless data transmission device (50) according to claim 5, characterized in that the electronic component (3) is formed by an unhoused semiconductor chip.

7. The contactless data transmission device (50) according to claim 6, characterized in that the semiconductor chip is mounted on the antenna conductor track (2) according to the flip-chip technique.

8. The contactless data transmission device (50) according to claim 7, characterized in that at least two of the at least two spiral winding branches (4', 4"; 5', 5"; 6', 6") of at least one spiral winding (4, 5, 6) are connected together between the branching points (7', 7"; 8', 8"; 9', 9") additionally by respectively at least one electrical connecting element (35', 35", 35''', 35''''; 36', 36", 36''', 36'''').

9. The contactless data transmission device (50) according to claim 8, characterized in that the antenna conductor track (2) is made from a conductive paste or a conductive varnish.

10. The contactless data transmission device (50) according to claim 9, characterized in that intermediate spaces between the spiral winding branches (4', 4"; 5', 5"; 6', 6") are filled with a dielectric substance having a dielectric constant which differs from that of the carrier (1).

11. The contactless data transmission device (50) according to claim 1, characterized in that the spiral winding branches (4', 4"; 5', 5"; 6', 6") of the antenna conductor track (2) and the areas of the spiral windings (4, 5, 6) running in the mounting region (10) are equally wide.

12. The contactless data transmission device (50) according to claim 1, characterized in that the electronic component (3) is formed by an unhoused semiconductor chip.

13. The contactless data transmission device (50) according to claim 12, characterized in that the semiconductor chip is mounted on the antenna conductor track (2) according to the flip-chip technique.

14. The contactless data transmission device (50) according to claim 12, characterized in that at least two of the at least two spiral winding branches (4', 4"; 5', 5"; 6', 6") of at least one spiral winding (4, 5, 6) are connected together between the branching points (7', 7"; 8', 8"; 9', 9") additionally by respectively at least one electrical connecting element (35', 35", 35'", 35""; 36', 36", 36'", 36"").

15. The contactless data transmission device (50) according to claim 1, characterized in that at least two of the at least two spiral winding branches (4', 4"; 5', 5"; 6', 6") of at least one spiral winding (4, 5, 6) are connected together between the branching points (7', 7"; 8', 8"; 9', 9") additionally by respectively at least one electrical connecting element (35', 35", 35'", 35""; 36', 36", 36'", 36"").

16. The contactless data transmission device (50) according to claim 1, characterized in that the antenna conductor track (2) is made from a conductive paste or a conductive varnish.

17. The contactless data transmission device (50) according to claim 16, characterized in that intermediate spaces between the spiral winding branches (4', 4"; 5', 5"; 6', 6") are filled with a dielectric substance having a dielectric constant which differs from that of the carrier (1).

18. The contactless data transmission device (50) according to claim 1, characterized in that intermediate spaces between the spiral winding branches (4', 4"; 5', 5"; 6', 6") are filled with a dielectric substance having a dielectric constant which differs from that of the carrier (1).

19. A valuable and/or security document comprising at least two document layers connected together through lamination, wherein one of the layers is formed by a contactless data transmission device (50) which comprises:
   an electrically insulating carrier (1),
   a circuit element arranged on the carrier (1), wherein the circuit element comprises a continuous antenna conductor track (2) in the form of at least one spiral winding (4, 5, 6) and respectively one terminal contact (15, 16) at the ends thereof, and
   an electronic component (3) electrically connected with the circuit element with at least two contact points (11, 12), wherein the electronic component (3) is placed in a mounting region (10) above the at least one spiral winding (4, 5, 6) and wherein the at least two contact points (11, 12) of the electronic component (3) are electrically connected with a respective terminal contact (15, 16) of the antenna conductor track (2),
   wherein at least one spiral winding (4, 5, 6) is branched outside the mounting region (10) between two respective branching points (7', 7"; 8', 8"; 9', 9") into at least two spiral winding branches (4', 4"; 5', 5"; 6', 6"),
characterized in that the circuit element furthermore comprises a capacitive circuit element and that the capacitive circuit element is formed by at least one blind conductor track (25, 26) which is respectively electrically connected with the terminal contact (15, 16) of the antenna conductor track (2).

20. A method for the manufacture of the contactless data transmission device (50) which comprises:
   an electrically insulating carrier (1),
   a circuit element arranged on the carrier (1), wherein the circuit element comprises a continuous antenna conductor track (2) in the form of at least one spiral winding (4, 5, 6) and respectively one terminal contact (15, 16) at the ends thereof, and
   an electronic component (3) electrically connected with the circuit element with at least two contact points (11, 12), wherein the electronic component (3) is placed in a mounting region (10) above the at least one spiral winding (4, 5, 6) and wherein the at least two contact points (11, 12) of the electronic component (3) are electrically connected with a respective terminal contact (15, 16) of the antenna conductor track (2),
   wherein at least one spiral winding (4, 5, 6) is branched outside the mounting region (10) between two respective branching points (7', 7"; 8', 8"; 9', 9") into at least two spiral winding branches (4', 4"; 5', 5"; 6', 6"),
characterized in that the circuit element furthermore comprises a capacitive circuit element and that the capacitive circuit element is formed by at least one blind conductor track (25, 26) which is respectively electrically connected with the terminal contact (15, 16) of the antenna conductor track (2);
   said method comprising the following method steps:
   i) providing a carrier (1),
   ii) printing a spiral-shaped circuit element onto the carrier (1), wherein the circuit element comprises an antenna conductor track (2) including terminal contacts (15, 16) of the antenna conductor track (2) and a capacitive circuit element, wherein the capacitive circuit element is formed by at least one blind conductor track (25, 26) which is respectively electrically connected with a terminal contact (15, 16) of the antenna conductor track (2),
   iii) placing an electronic component (3) above the antenna conductor track (2) so that contact points (11, 12) of the electronic component (3) lie opposite the terminal contacts (15, 16), and contacting the electronic component (3) with the antenna conductor track (2).

* * * * *